(12) United States Patent
Newcomb (10) Patent No.: US 8,225,251 B2
(45) Date of Patent: Jul. 17, 2012

(54) CIRCUIT STATES

(76) Inventor: Jesse Conrad Newcomb, Daly City, CA (US)

( * ) Notice: Subject to any disclaimer, the term of this patent is extended or adjusted under 35 U.S.C. 154(b) by 259 days.

(21) Appl. No.: 12/694,199

(22) Filed: Jan. 26, 2010

(65) Prior Publication Data

US 2010/0306608 A1 Dec. 2, 2010

Related U.S. Application Data (60) Provisional application No. 61/183,405, filed on Jun. 2, 2009.

(51) Int. Cl.
*G06F 17/50* (2006.01)

(52) U.S. Cl. .......................... 716/106; 716/100; 716/101

(58) Field of Classification Search .................... 706/46; 714/736; 716/100, 101, 106
See application file for complete search history.

(56) References Cited

OTHER PUBLICATIONS

Tricas et al.,"Using Linear Programming and the Petri Net Structure for Deadlock Prevention in Sequential Source Allocation Systems", 2005, Actas de las XIII Jornadas de Concurrencia y Systems Distribuidos, pp. 65-77.*

Hubner et al., "Deformable Radial Basis Functions", 2007, J. Marques de Sa et al., ICANN 2007, Part I, LNCS 4668, pp. 411-420.*

* cited by examiner

*Primary Examiner* — Sun Lin
(74) *Attorney, Agent, or Firm* — Stephen E. Zweig (57) ABSTRACT

Systems and methods for deriving a net equation representing a net state of an analog circuit net, wherein the net equation is derived from at least one other net state, determining a truthfulness of the net equation, reporting the truthfulness.

20 Claims, 9 Drawing Sheets

CIRCUIT STATES

RELATED APPLICATIONS

This application is related to and claims priority to commonly assigned Provisional U.S. Patent Application No. 61/183,405, titled "FLOATING GATE PREDICTOR," by Jesse Conrad Newcomb, filed Jun. 5, 2009, which is incorporated by reference herein in its entirety.

FIELD

Embodiments of the present invention relate in general to the field of circuits.

BACKGROUND

Floating gates are a risk in the circuit industry, for one floating gate may cause reduced functionality or permanently kill a circuit. One approach to resolving floating gates is to predict and/or detect floating gates using a time domain simulation. Unfortunately, time domain simulations may not always determine if a gate floats. What is needed is a more accurate way to determine if a gate floats.

SUMMARY

Systems and methods for determining floating gates are discussed herein. The method comprises deriving a net equation representing a net state of an analog circuit net, wherein the net equation is derived from at least one other net state, determining a truthfulness of the net equation, reporting the truthfulness.

BRIEF DESCRIPTION OF THE DRAWINGS

The accompanying drawings, which are incorporated in and form a part of this specification, illustrate embodiments of the presented technology and, together with the description, serve to explain the principles of the presented technology.

DESCRIPTION OF EMBODIMENTS

Reference will now be made in detail to various embodiments of the present invention, examples of which are illustrated in the accompanying drawings. While the present invention will be described in conjunction with the various embodiments, it will be understood that they are not intended to limit the invention to these embodiments. On the contrary, embodiments are intended to cover alternatives, modifications and equivalents, which may be included within the spirit and scope of the appended claims. Furthermore, in the following description of various embodiments, numerous specific details are set forth in order to provide a thorough understanding of embodiments. However, it will be recognized by one of ordinary skill in the art that embodiments may be practiced without these specific details. In other instances, well known methods, procedures, components, and circuits have not been described in detail as not to unnecessarily obscure aspects of the embodiments.

In various embodiments, a net analyzer is discussed. The net analyzer may be used to determine if a transistor gate floats by determining if a net, electrically coupled to the gate, floats. The net is determined to float or not to float by using net equations.

Figure 1:
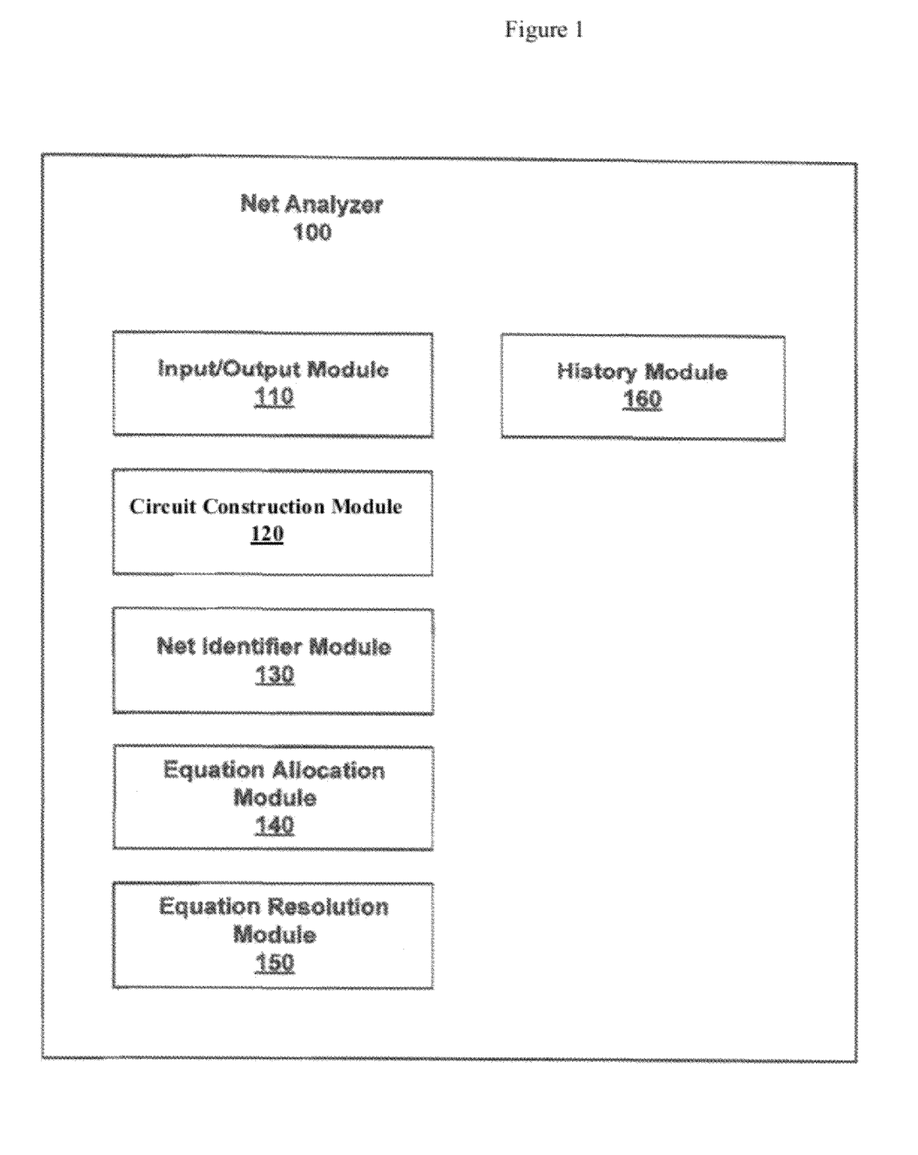
FIG. 1 illustrates a net analyzer upon which embodiments of the present invention may be implemented.

FIG. 1 illustrates a net analyzer 100 upon which embodiments of the present invention may be implemented. In one embodiment, the net analyzer 100 comprises an input/output module 110, a circuit construction module 120, a net identifier module 130, a net equation allocation module 140, a net equation resolution module 150, and a history module 160. In other embodiments, modules of the net analyzer 100, are merged and/or performed outside the net analyzer 100.

The input/output module 110 receives circuit configuration information and returns circuit, node and/or net information to a user. The circuit information contains a netlist and/or information regarding a circuit, such as specifications and configurations of nodes, nets, and the like. The circuit information may be in a standard format, such as SPICE, or any other format that has specification entries for nodes, nets, and the like. The returning information may be formatted for use in a spreadsheet, for display on a terminal, and the like.

The circuit construction module 120 receives the circuit information from the input/output module 110. In one embodiment, the circuit construction module 120 converts circuit information to an internal circuit. The internal circuit is a memory footprint of nets, pins, devices, and the like. After which, the net analyzer 100 traverses and queries the internal circuit to obtain objects and/or information as needed. For example, nets from a netlist are placed in memory, associated with names from the netlist, and coupled with relevant device connections also from the netlist.

The net identifier module 130 identifies net that may potentially float and/or are susceptible to float. The net identifier module 130 determines a potential to float by querying the circuit construction module 120 to determine which nets are connected to MOS gates, have constant connections, such as a power tie, and the like. A net with only MOS gates connections has a potential to float. A net with a connection to a constant power tie will not float, thereby making a test for floating unnecessary. A net with connections to MOS gates and other devices, such as resistors, and the like, may have a potential to float.

In one embodiment, after the net identifier module 130 determines one or more nets that have a potential to float, the nets are mapped to equations to determine if they may float, as discussed herein. In another embodiment, nets are mapped after the net identifier module 130 determines has finished determine the float potential of the nets.

The equation allocation module 140 receives a net from the net analyzer 100 to be characterized with a net equation. The net equation represents a proposed net state using one or more states of other nets. The proposed net state and the one or more states of other nets are float/floating, high, or low. For example, Net 1 is postulated to float (equal to Z) if and only if Net 2 is low (equal to 0) and Net 3 is high (equal to 1). The one or more states of the other nets are determined to be true, false, or possible. For example, if a Net is equated to be high, that is Net=1, and the Net is always low or floats, then the state of [Net=1] is possible, where possible may mean:

Net proposed=1, Net actually 0, →proposal is false.
Net proposed=1, Net actually 1, →proposal is true.
Net proposed=1, Net actually Z, →proposal is possible.

Thus, a net may be defined as possible, when it is possible that the proposed state is the actual state. A net state is determined by the equation resolution module 150 discussed below.

The equation resolution module 150 determines net states and resolves net equations. In one embodiment, the equation resolution module 150 communicates with the equation allocation module and the net identifier module 130. In another embodiment, the equation resolution module 150 communicates with the net analyzer 100. The equation resolution module 150 resolves a net equation by determining and/or resolving any logic combined with other net states in the equation. In one embodiment, a net equation is resolved by determined if the proposed net state is either true or false. For example, if the proposed net state is to float, and a basis to obtain a "float" is satisfied, then a net equation is resolved to be true, that is, the net may float.

In another embodiment, in addition to "true" and "false" a net state is resolved as "possible." The possible resolution may be assigned to a net state when certain conditions occur, such a time-out or time limit, a temporarily unresolved net equation, a depth limit, a branch limit, and the like. The certain conditions may be identified as a predetermined event. In one embodiment, a forced stop, that is the time-out and/or time limit, may be user predetermined prior to the net analyzer 100 receiving circuit configuration information. In another embodiment, the time-out is determined on the fly via user response to a prompt, conditionally based, such as a complexity of a net equation, and the like. The temporarily unresolved net equation may be later resolved by additional user input, the net analyzer 100 making assumptions, such as forcing values to net states, and/or removing previously determined "suspicious" nets from the net equation. A suspicious net is a net that the net analyzer 100 identifies as a potential floating net and may be reported to the user.

The history module 160 stores net state information. The net state information contains information resolved by the equation resolution module 150. In one embodiment, the history module 160 communicates with the equation allocation module 140 to simplify the net equation. One simplification may be substitution of the resolved net state in place of the net state. For example, instead of added Net B equals "high" (the net state), insert "true" (the resolution of the net state) into the equation. In another embodiment, the history module 160 communicates with the equation resolution module 150, whereby the equation resolution module queries the history module 160 for previous net state resolutions. Net equations and net equation resolution are discussed with respect to FIGS. 2-4 and 7, and further herein.

In one embodiment, the net identifier module 130, the equation allocation module 140, the equation resolution module 150, and the history module 160 are combined into one or more modules. In another embodiment, the equation resolution module 150 and the history module 160 are combined into one module. It will be recognized by one of ordinary skill in the art that any combination of modules within the net analyzer 100 may be practiced without specific details of the functions within the modules, and is included within the spirit and scope of the embodiments.

Figure 2:
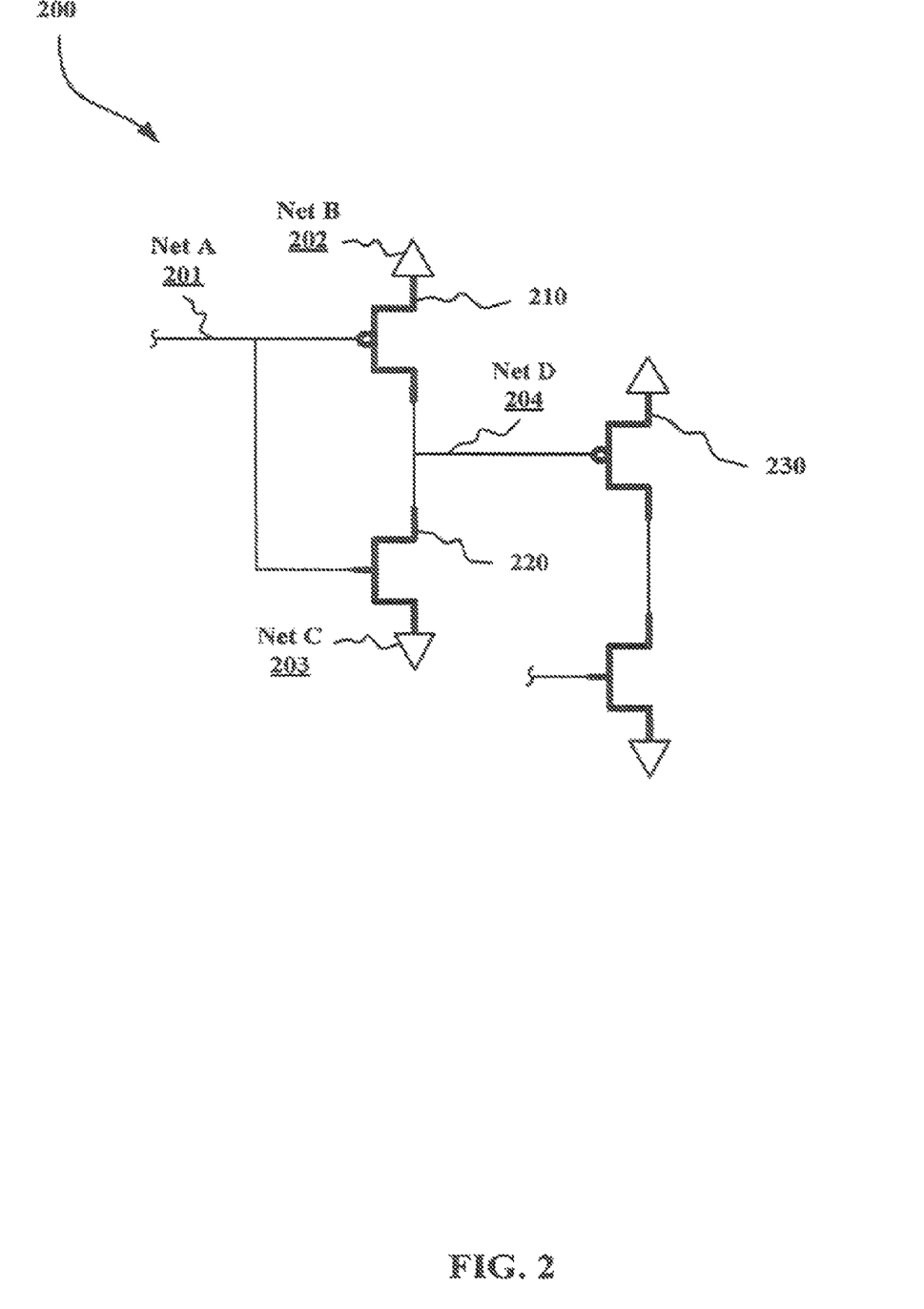
FIG. 2 illustrates an example to show that a net may not float, upon which embodiments of the present invention may be implemented.

FIG. 2 illustrates an example 200 to show that a net may not float, upon which embodiments of the present invention may be implemented. The example 300 shows Net A 201 coupled to device 210 and device 220, Net B 202 coupled to device 210, Net C 203 coupled to device 220, and Net D 204 coupled to device 210, device 220 and device 230. In the example 200, the net analyzer 100 determines that a gate of device 230 is coupled to the Net D 204, wherein the Net D 204 is coupled to devices that have varying states, and thereby may "suspect" that the gate of device 230 may float. To determine if the gate of device 230 may float, the net analyzer 100 assigns the proposed net state of "float" to Net D 204 represented by the expression:

$$\text{Net } D=Z \text{ if } [\text{device } 210=Z]\&[\text{device } 220=Z] \quad (a)$$

wherein Z equals "float"

As the net analyzer 100 knows device 210 is a PMOS, a p-channel MOSFET (metal-oxide semiconductor field-effect transistor), the net analyzer 100 determines that in order for device 210 to float, either the gate needs to be "high" (that is, Net A 201 needs to be "high") or Net B 202 needs to float. Therefore, the net analyzer 100 may substitute the following expression into the above equation (a):

$$[\text{device } 210=Z] \text{ if } [\text{Net } A=\text{high}]|[\text{Net } B=Z] \quad (b)$$

Also, as the net analyzer 100 knows device 220 is a NMOS, an n-channel MOSFET, the net analyzer 100 determines that in order for device 220 to float, either the gate needs to be "low" (that is, Net A 201 needs to be "low") or Net C 203 needs to float. Therefore, the net analyzer 100 may substitute the following expression into the above equation (a):

$$[\text{device } 220=Z] \text{ if } [\text{Net } A=\text{low}]|[\text{Net } C=Z] \quad (c)$$

The substitution of equations (b) and (c) into (a) results in the following equation where Net D will float if:

$$[[\text{Net } A=\text{high}]|[\text{Net } B=Z]]\&[[\text{Net } A=\text{low}]|[\text{Net } C=Z]]$$

In the example 200, Net B 202 and Net C 203 are constant powers, whereby the net analyzer 100 removes constant powers, resulting in:

$$[\text{Net } A=\text{high}]\&[\text{Net } A=\text{low}] \quad (d)$$

The net analyzer 100 evaluates expression (d) as a contradiction, thereby concluding that the proposed network state of "float" is false, that is, the gate of device 230 may never float.

Figure 3:
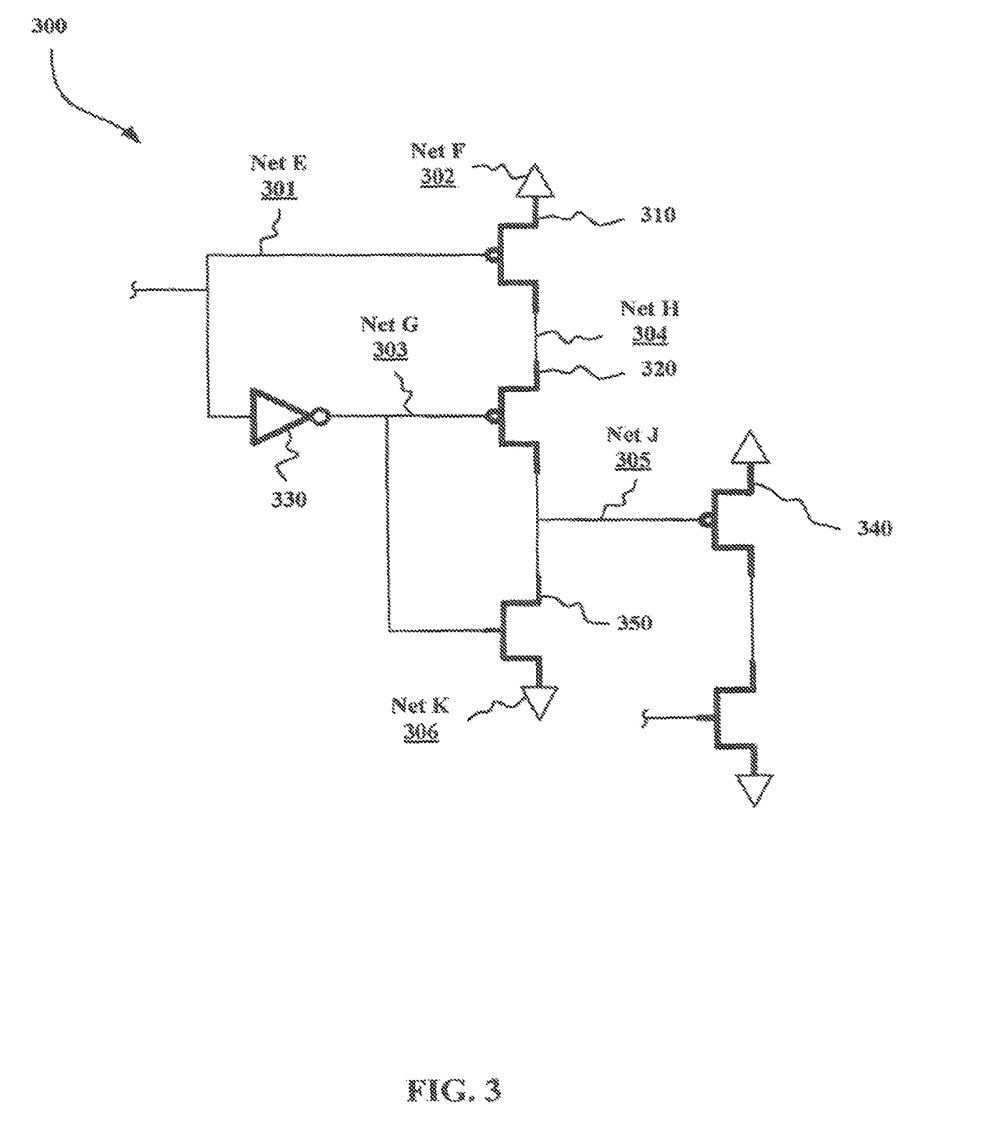
FIG. 3 illustrates an example to show that a net may float, upon which embodiments of the present invention may be implemented.

FIG. 3 illustrates an example 300 to show that a net may float, upon which embodiments of the present invention may be implemented. The example 300 shows Net E 301 coupled to device 310 and device 330, Net F 302 coupled to device 310, Net G 303 coupled to devices 320-330 and device 350, Net H 304 coupled to device 310 and device 320, Net J 305 coupled to device 320 and devices 340-350, and Net K 306 coupled to device 350. In the example 300, the net analyzer 100 determines that a gate of device 340 is coupled to the Net J 305, wherein the Net J 305 is coupled to devices that have varying states, and thereby may "suspect" that the gate of device 340 may float. To determine if the gate of device 340 may float, the net analyzer 100 assigns the proposed net state of "float" to Net J 305, wherein the hypothesis is "Does Net J float (equals Z)?", whereby the hypothesis of "Net J floats" is true if conditions are satisfied, that is, device 320 and device 350 float, and wherein the hypothesis is represented by the expression:

Net J=Z if [device 320=Z]&[device 350=Z]  (e)

As the net analyzer 100 knows device 320 is an PMOS, the net analyzer 100 determines that in order for device 320 to float, either the gate needs to be "high" (that is, Net G 303 needs to be "high") or Net H 304 needs to float. Therefore, the net analyzer 100 may substitute the following expression into the above equation (e):

[device 320=Z] if [Net G=high]|[Net H=Z]  (f)

Also, as the net analyzer 100 knows device 350 is a NMOS, the net analyzer 100 determines that in order for device 350 to float, either the gate needs to be "low" (that is, Net G 303 needs to be "low") or Net K 306 needs to float. As the net analyzer 100 knows Net K 306 is a constant power and may not float, the net analyzer 100 does not include an expression "Net K=Z". Therefore, the net analyzer 100 may substitute the following expression into the above equation (e):

[device 350=Z] if [Net G=low]  (g)

The substitution of equations (f) and (g) into (e) results in the following equation where Net J will float if:

[[Net G=high]|[Net H=Z]]&[[Net G=low]]  (h)

The net analyzer 100 notices a contradiction of "Net G=high" and "Net G=low", and thereby may expand equation (h) into two equations, one for Net G high and one for Net G low, but as the equation requires net G to be low, the net analyzer 100 reduces the equation (h) by removing the "Net G=high", thus, Net J 305 will float if

[Net H=Z]&[Net G=low]  (i)

The net analyzer 100 determines substitute expressions for Net H 304 to be: Net H=Z if Net E=high. The net analyzer 100 consults a lookup table, as discussed herein, to determine device 330 is an inverter and finds the inputs needed for Net G 303 would be Net E=high, thereby, Net G=low if Net E=high. Thus, making substitutions into equation (i), the net analyzer 100 determines,

[Net E=high]&[Net E=high]  (j)

Upon further reduction, the net analyzer 100 determines the equation (j) may be represented by a single expression, "Net E=high". As Net E 301 may go high, the net analyzer 100 determines that the above hypothesis, represented by equation (e), is true, thereby, the Net J 305 may float, and thus the gate of device 340 may float.

In one embodiment, the net analyzer 100 refers to a logic table and/or a lookup table (not depicted). Some logic devices represented in the lookup table include, a PFET, an NFET, a PFET diode, an NFET diode, a resistor, and the like. The lookup table contains conditions for logic devices to obtain a specific output. For example, the table for a resistor has a condition for an output to be similar as an input, that is, high in yields high out, which may be symbolically represented by: B=0→A=0; B=1→A=1; B=z→A=z. The symbols A and B represent abstract names, "1" is high and "0" is low and "z" represents "float." For FET devices, G is a gate. A PFET has the conditions/outputs B=0→false; B=1→A=1 & (G=0|G=z). An NFET has the conditions/outputs A=0→B=0 & (G=1|G=z); A=1→false; A=z→B=z|G=0|G=z. A PFET diode has the conditions/outputs when S/D=1→G=1 (that is the diode will bleed up to 1). An NFET diode has a conditions when S/D=0→G=0 (diode will bleed down to 0).

Figure 4:
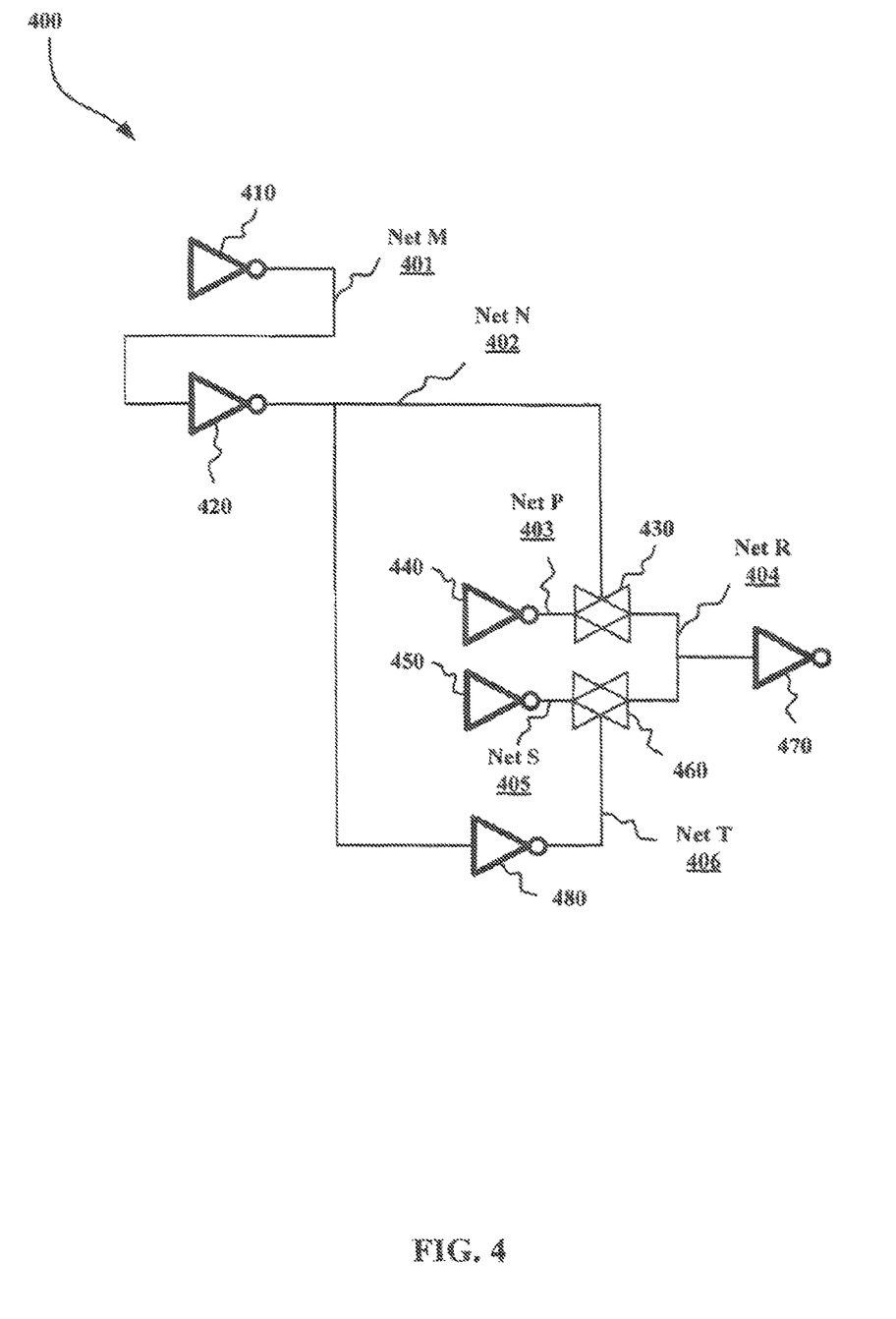
FIG. 4 illustrates another example to show that a net may not float, upon which embodiments of the present invention may be implemented.

FIG. 4 illustrates another example 400 to show that a net may not float, upon which embodiments of the present invention may be implemented. The example 400 shows Net M 401 coupled to device 410 and device 420, Net N 402 coupled to devices 420-430 and device 480, Net P 403 coupled to device 430 and device 440, Net R 404 coupled to device 430 and devices 460-470, Net S 405 coupled to device 440 and device 460, and Net T 406 coupled to device 460 and device 480. In the example 400, the net analyzer 100 determines an input to device 470 is suspect, and therefore analyzes Net R 404. To determine if the Net R 404 floats, the net analyzer 100 knows that the devices 440-450, transfer gates, need both be turned off, that is control equal 0, or need to have a Z input. Thus, the net analyzer 100 postulates that Net R=Z if:

[Net P=Z]|[Net N=0]&[Net S=Z]|[Net T=0]  (k)

The net analyzer 100 knows the inverters have no possible Z output, as determined from earlier findings, so the net analyzer 100 knows "Net P 403=Z" is false and "Net S 405=Z" is false. The net analyzer 100 removes the inverter terms from equation K to obtain: [Net N=0] & [Net T=0].

The net analyzer 100 then expands the remaining terms (by working upstream) in equation (1) to by replacing "Net N 402=0" with "Net M 401=1" and replacing "Net T 406=0" with "Net N 402=1". In one embodiment, the net analyzer 100 reviews a history of predetermined nets, such as Net N 402 in example 400, to find a conflicting requirement, that is "Net N 402=0" and "Net N 402=1". As the net analyzer 100 notices that these conflicting terms were "ANDed" without any other possible OR terms, the existence of variable of "Net N 402" in the equation (k) is necessary, and thus may not be reduced, thereby disproving the hypothesis that Net R 404 may float. Thus, using expressions and a hypothesis, the net analyzer 100 proves, in example 400, a net may be in a configuration whereby the net never floats.

Figure 5:
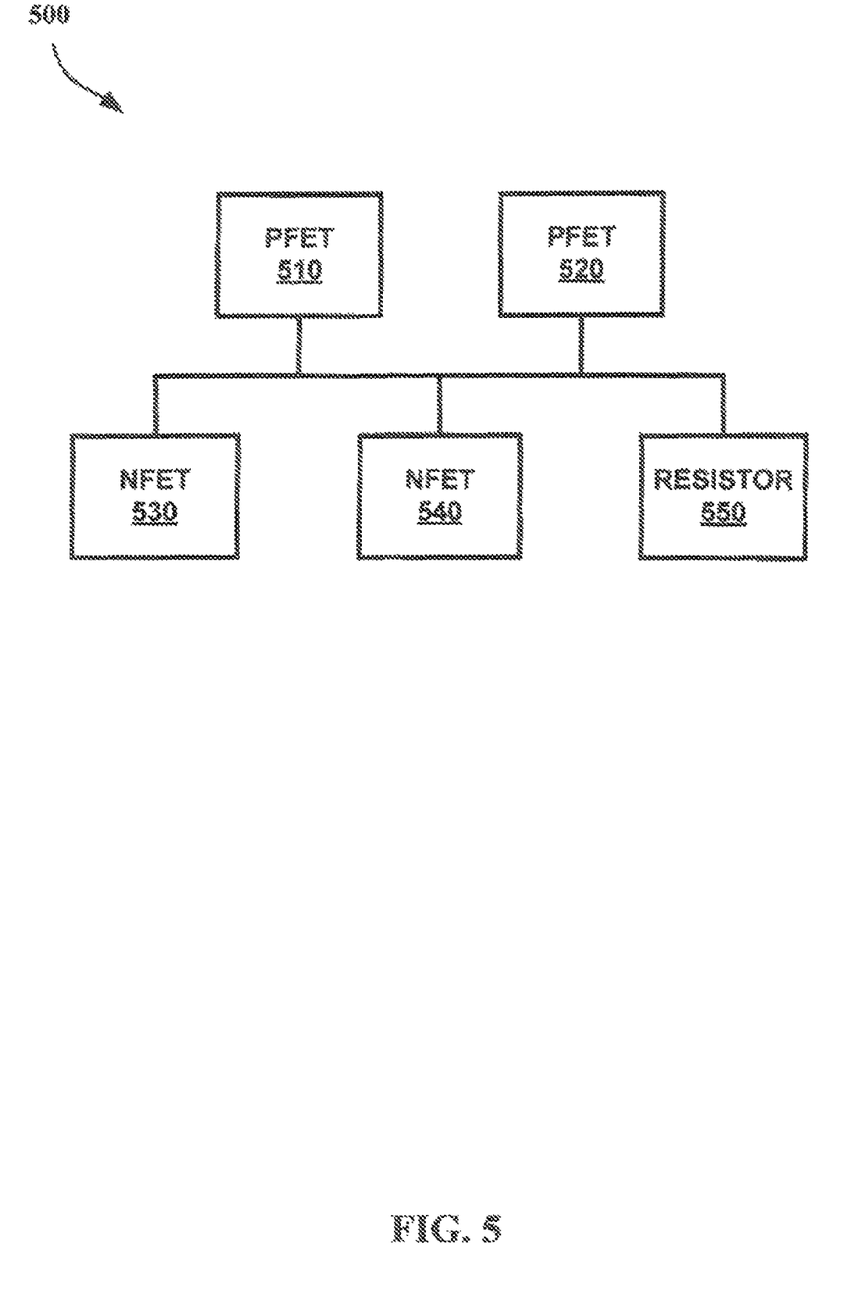
FIG. 5 illustrates an example for detecting floating nets by combining multiple devices on a single net, upon which embodiments of the present invention may be implemented.

FIG. 5 illustrates an example 500 for detecting floating nets by combining multiple devices on a single net, upon which embodiments of the present invention may be implemented. The example 500 shows Net 505 coupled to a PFET 510, a PFET 520, an NFET 530, an NFET 540, and a resistor 550. In one embodiment, when the net analyzer 100 analyzes a net, the net analyzer 100 considers combinations of several devices based on a lookup table and based on a type of device coupled to the net. For example, if the net analyzer 100 determines if Net 505 is high, then an expression may be used such as: PFET 510=1|PFET 520=1|Resistor 550=1, as any PFET or resistor may pull high. In this situation, the net analyzer 100 does not use expressions for the NFETs 530-540, as the NFET may only pull the Net 505 to 0, and the net analyzer 100 is "optimistic" by looking at every combination where the Net 505 may be high. Additionally, by not including the NFETs, the net analyzer 100 has fewer expressions in the equation.

In one embodiment, when the net analyzer 100 analyzes the Net 505 to be low, the net analyzer 100 may use an expression: NFET 530=0|NFET 540=0|Resistor 550=0, as any NFET or any resistor may pull low. In this situation, the net analyzer 100 does not use expressions for the PFETs 510-520, as an "optimistic" approach is used, discussed above.

In one embodiment, when the net analyzer 100 analyzers the Net 505 to be floating, the net analyzer 100 may use an expression: PFET 510=z & PFET 520=z & NFET 530=z & NFET 540=z & Resistor 550=z. The net analyzer needs to account for all devices that may pull up or down, and as such, needs to check for all devices to be off and/or float.

In another embodiment, the net analyzer 100 determines if any of the FETs are wired as diodes. A diode can pull 1/0 only if other opposing paths are off, as a diode is a weak bleeder path. In one embodiment, when the net analyzer 100 determines if a net may go high, and where PFET 510 is wired as a diode, the equation may be:

[[PFET 510=1]&[NFET 530=z]&[NFET 540=z]& [Resistor 550=z]]|[PFET 520=1]|[Resistor 550=1]

In one embodiment, when the net analyzer 100 determines if a net may go low, and where NFET 530 is wired as a diode, the equation may be:

[[NFET 530=0]&[PFET 510=z]&[PFET 520=z]|[Resistor 550=z]]|[NFET 540=0]|[Resistor 550=0]

It will be recognized by one of ordinary skill in the art that any combination of devices may be analyzed by the net analyzer 100, and may be practiced without specific details of the functions within the configuration, and is included within the spirit and scope of the embodiments.

Figure 6:
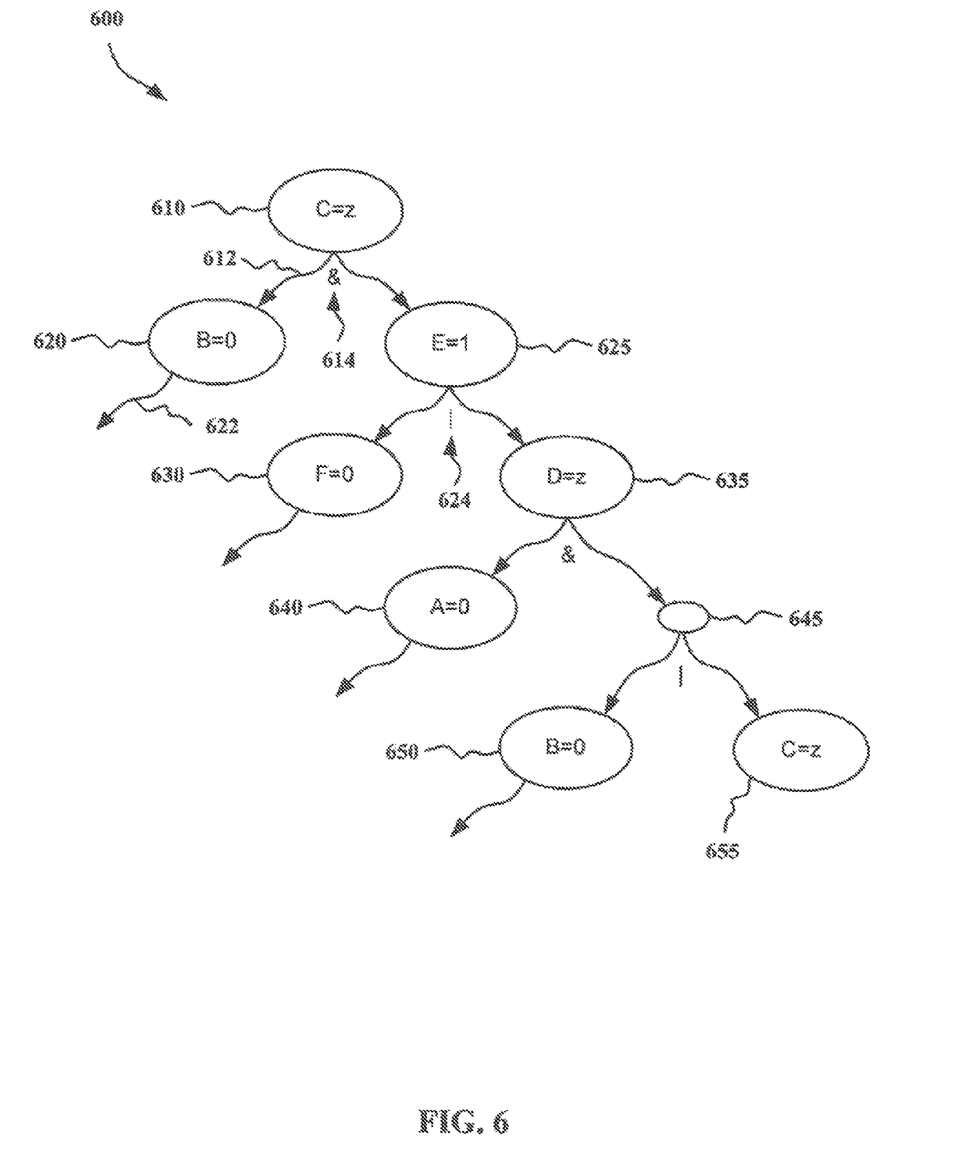
FIG. 6 is a diagram of a tree of a method for detecting floating nets, upon which embodiments of the present invention may be implemented.

FIG. 6 is a diagram of a tree 600 of a method for detecting floating nets, upon which embodiments of the present invention may be implemented. As illustrated, the tree 600 comprises nodes, such as node 610, relationships, such as relationship 612, and expressions, such as expression 614. The tree 600 is used to illustrate logic expressions, node relationships, and the like. The relationships couple two or more nodes. For example, the relationship 612 couples node 610 and node 625. The expressions are logic dispositions. The tree 600 expands from node 610, a top node, downward as the net analyzer 100 resolves a hypothesis. The top node, the node 610, of the tree 600 contains a hypothesis. The hypothesis is "C=z", that is, "Does net C float?" As the net analyzer 100 progresses down the tree 600, the hypothesis may be either proved or disproved.

From the tree 600, specifically from node 610, node 620 and node 625, the net analyzer 100 determines that C=z if B=0 & E=1. The net analyzer 100 leaves node 620 ("B=0") for now, and explores down node 625, to make a substitution, that is, "E=1 if E=0 OR D=z". From the tree 600, the net analyzer 100 knows the following equations:

$C=z$ (hypothesis)

$C=z$ if $B=0 \& E=1$ $E=1$ if $F=0 | D=z$ $D=z$ if $A=0 \& (B=0 | C=z)$

The net analyzer 100 discovers that the expression, "B=0", appears in two different nodes, node 620 and node 650. In one embodiment, two like expression are called twins. The net analyzer 100 also notices "C=z" appears in the node 610 and node 655. As node 610 represents the hypothesis, this particular twin is assumed to be the actual state.

If unresolved, the net analyzer 100 explores other relationships, such as relationship 627. If the net analyzer 100 finds that "B=0", satisfying node 620 and node 650, and finds that "A=0" is true, then logic of the tree 600 would be satisfied, and the net analyzer 100 has resolved the hypothesis, where C=z. On the other hand, if the net analyzer 100 does not find "B=0" and "A=0", then the net analyzer 100 needs to continue exploring to determine is the tree 600 resolves true or false.

In one embodiment, the net analyzer 100 continues exploring by expanding branches until the tree 600 becomes too large to manage, whereby the net analyzer 100 resolves the hypothesis as a virtual truth. A virtual truth is assumed as a truth for practical purposes. The net analyzer 100 may determine if the tree 600 is too large to manage based on computer resources, such as memory or CPU speed, and the like, a predetermined user input, such as a time, and/or based on circuit response characteristics, such as exploring further if fewer or more instances where the hypothesis is not resolved. For example, if during final testing of a circuit, a user requests fewer virtual truths, as opposed to allowing for more virtual truths during initial testing of a circuit.

If the net analyzer 100 finds nodes that repeat, and having different states, then the net analyzer 100 associates this as a conflict. For example, if the node 650 had the state "B=1", not depicted, instead of "B=0", as is the state of the node 620. The conflict may block the logic of the tree 600, and prevent a true from reaching the root. If no other path exist for a true to propagate up without the conflict, then the circuit is proven false, that is the hypothesis is false, and for the tree 600, net C can not float.

Figure 7:
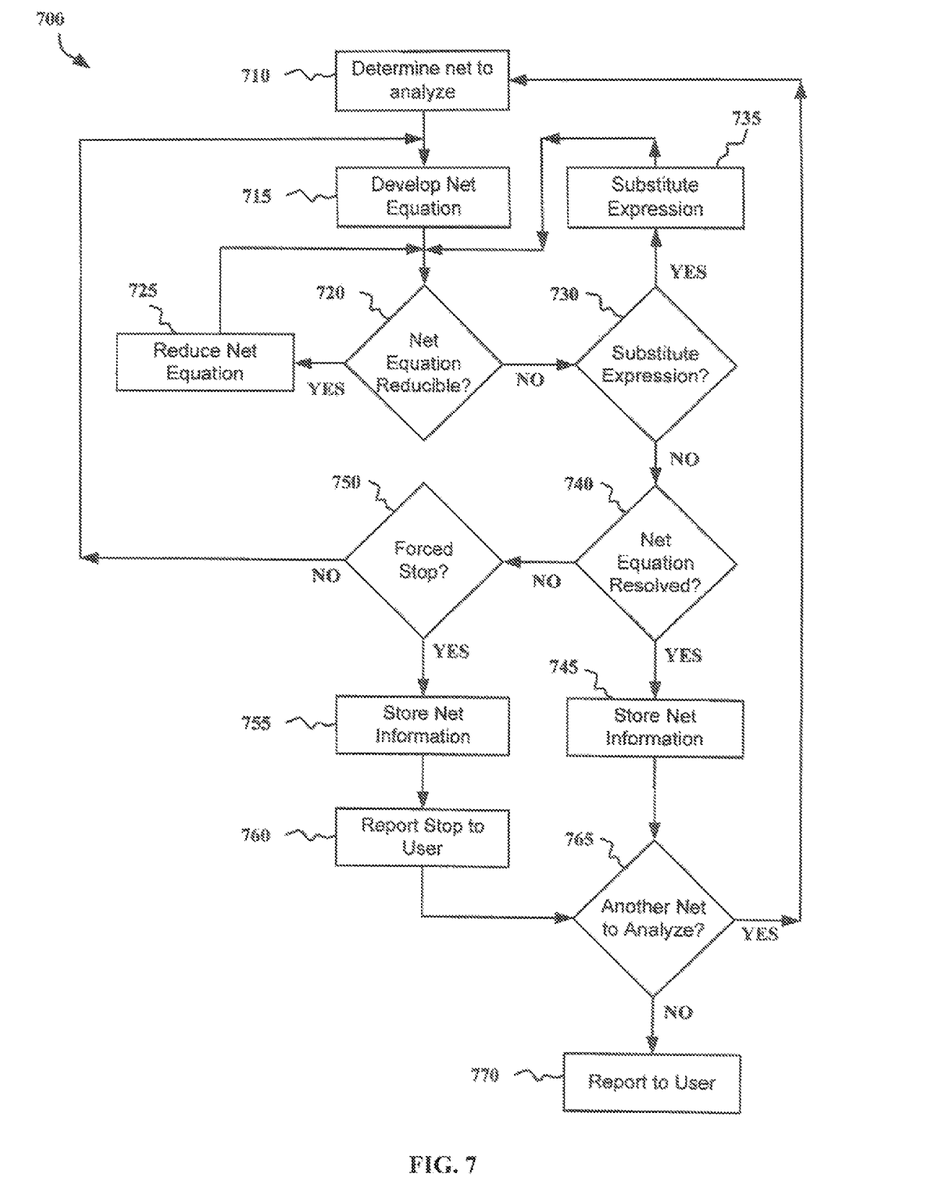
FIG. 7 is a logic diagram of a method for detecting floating nets, upon which embodiments of the present invention may be implemented.

FIG. 7 is a logic diagram of a method for detecting floating nets, upon which embodiments of the present invention may be implemented. At 710, the net analyzer 100 determines a net to analyze. The determination may be based on suspect nodes, as discussed herein, methodical, or user defined, such as looking at a particular section of a circuit. After the net analyzer determines the net to analyzer, at 715, the net analyzer 100 develops a net equation to represent a state based on a hypothesis, as discussed herein.

At 720, the net analyzer 100 determines if the net equation is reducible, as discussed herein. If the net equation is reducible, then the net equation is reduced at 725 and loops back to check if the net equation may be reduced again at 720. If the net equation is not reducible, at this time, the net analyzer 100 determines, at 730, if a substitute expression may be made, as discussed herein. If a substitute expression may be made, the net analyzer substitutes an expression at 735. If the substitution is made, the net analyzer 100 checks again to determine if the net equation is reducible at 720.

If the net analyzer 100 can not substitute an expression, at this time, the net analyzer 100 determines if the net equation has been resolved at 740, that is has the hypothesis been proved or disproved, as discussed herein. If the equation has been resolved, information is stored at 745, as discussed here. If the equation has not been resolved, at 750 the net analyzer 100 determines if a forced stop (a predetermined event) is justified, as discussed herein. If the forced stop is not justified, the net analyzer 100 explores another node and develops another net equation at 715, and continues the process. If the net analyzer 100 determines a forced stop is justified, then the net analyzer 100 stores net information at 755, reports forced stop information and any net state information at 760.

After net state information is stored and/or reported at 745 or 760, the net analyzer 100 determines if another net is to be analyzed. If another net is to be analyzed, the net analyzer 100 determines another net equation at 710, and repeats the process until the net analyzer 100 determines there are no more nets to analyze. After the net analyzer 100 determines there are no more nets to analyzer, the net analyzer 100 reports to the user, such as net information, floating nets and/or gates, suspect nets and/or gates, iterations and complexity of net equations, and the like.

Figure 8:
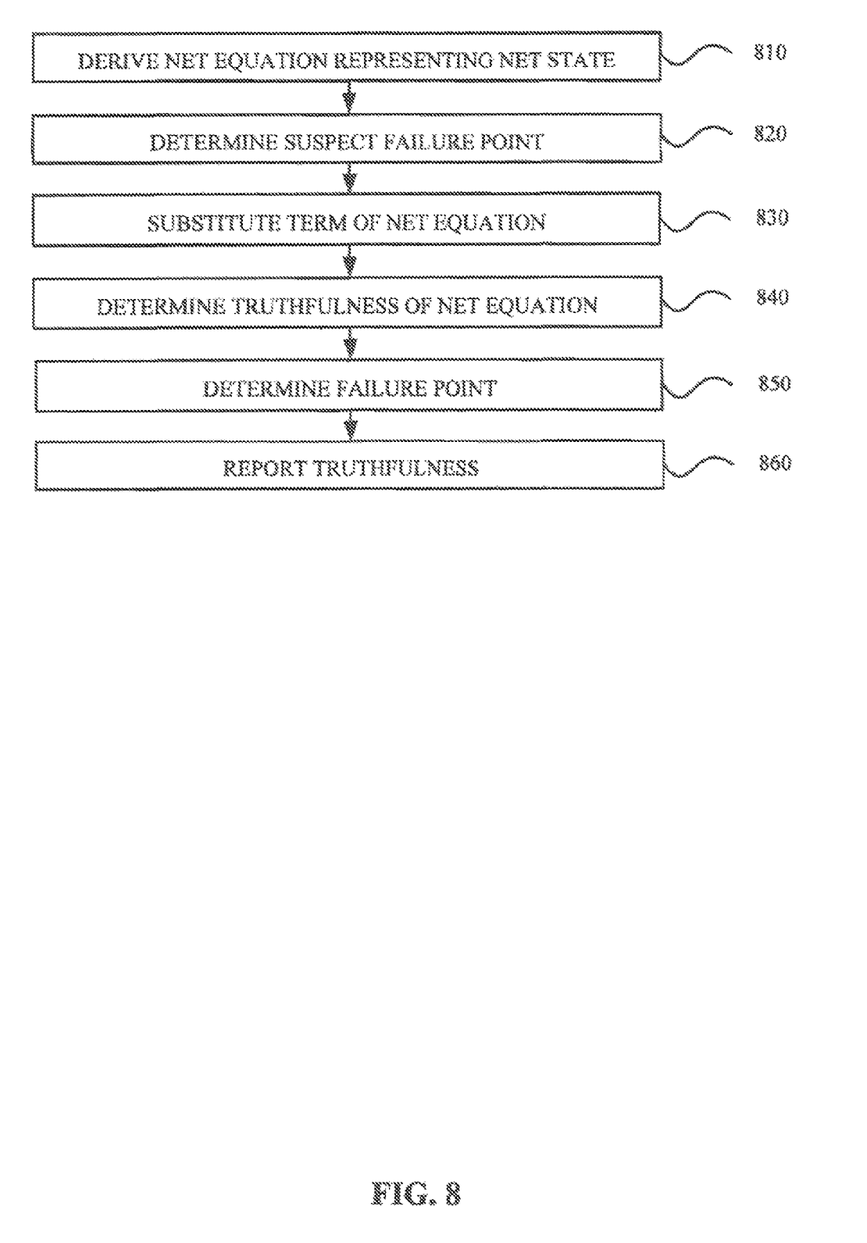
FIG. 8 is a flow chart of a method for detecting floating nets, upon which embodiments of the present invention may be implemented.

FIG. 8 is a flow chart of a method for detecting floating nets, upon which embodiments of the present invention may be implemented. In step 810 the net analyzer 100 derives a net equation representing a net state of an analog circuit net. The net equation is derived from at least one other net state, as discussed herein.

In various embodiments, the net analyzer 100 determines a suspect failure point prior to determining the truthfulness of the net equation. The suspect failure point is determined based on device configuration, as discussed herein.

After the net equation is derived, the net analyzer resolves the net equation making substitutions, reductions and other approaches as explained in FIG. 7 and herein. In step 830, the net analyzer 100 substitutes a term of the net equation using at least one additional net state. For example, Net 2=1 is substituted with Net 3=0 and Net 4=Z. In various embodiments, the substitution terms are determined as the net analyzer is resolving the net equation. For example, the "Net 3=0" and "Net 4=Z" terms are determined by the net analyzer 100 after reviewing the topology of the circuit. In other embodiments, the net analyzer 100 uses predetermined substitution terms based on previously identified device components and/or configurations. For example, the net analyzer 100 may substitute terms based on a previously identified configuration of devices, and/or previously defined set of devices/configuration. The previously identified configuration may be identified during a previous review of the same devices in a prior resolution of a different net equation or a prior branch of the same net equation. The previously defined set of devices/configuration may be pre-assigned by a user. For example, a user defines a configuration of diodes, a PMOS and a NMOS to have a particular net state.

After the net equation is derived, the net analyzer resolves the net equation and determines the next course of action. In step 840, the net analyzer 100 determines the truthfulness of the net equation, as defined in FIG. 7 and herein. After the net equation is resolved and the truthfulness determined, the net analyzer 100 tests the hypothesis to determine any circuit issues, such as a failure point.

In step 850, the net analyzer 100 determines a failure point. In various embodiments, a user may identify a potential failure point and request the net analyzer 100 to determine is the potential failure point is a failure point. A failure point is any point, net or device that will cause an analog circuit to fail, and/or generate an unexpected result. Some examples of failures or unexpected results are memory leaks, shorts, accessing floating values, and the like. In other embodiments, the net analyzer 100 determines and reports failure points independent of any user identified potential failure points, that is the net analyzer 100 review the entire circuit and determines any and/or all failure points. In one embodiment, a truthfulness indicated a failure point, for example, if Net M floats, and the net analyzer 100 determines Net M to float (a true hypothesis), then the net analyzer determines the truthfulness to be a failure point. A true hypothesis does not necessarily correlate to a failure, as "Net N=Z" may have no effect as a failure point.

In various embodiments, the failure point is determined with one evaluation of the net equation. The net analyzer 100 may determine a failure point for one evaluation of one net equation, where the evaluation may take several iterations of the substitutions, reductions, and the like, as detailed in FIG. 7 and herein.

In various embodiments, the failure point is determined with a certainty of 100%. The net analyzer 100 may determine 100% certainty, because a hypothesis may be determined to be true or false with no uncertainty. This is unlike other circuit analyzers that are time dependent, where an analysis is performed with an estimated certainty, such as 99.99%, as determined by a time and/or cycle iteration variable wherein a circuit does not fail. As the net analyzer 100 uses a hypothesis to determine a net equation, the net analyzer 100 resolves net equations and determines failure points independent of a time domain variable. In various embodiments, the net analyzer 100 determines all the failure points in an analog circuit.

In various embodiments, the net analyzer 100 determines failure points with only a user input of power rail definitions. A power rail definition is defining a power to a specific voltage or range of voltages, such as a range of −1 to +2 ivolts. In other embodiments, the user defines input/output voltages and/or currents of one or more devices and/or power rails.

In various embodiments, the net analyzer 100 predicts a certain net state will not occur. For example, the net analyzer 100 predicts and determines a net will not float, and/or not be a failure point. In various embodiments, the net analyzer 100 determines and/or predicts a device state signal is float, on or off. Depending on the device type, the net analyzer 100 predicts, based on net equation resolution, the device state. For example, the net analyzer 100 predicts and determines a PMOS to be on.

In step 860, the net analyzer 100 reports the truthfulness and/or failure points to the user, as discussed herein. Based on the user requirements, and/or the net analyzer 100, reports may vary to report failure points, net states, potential failure points, and the like. Potential failure points may occur when a net equation of not resolved definitely, but when a predetermined event, such as a forced stop, occurs, as discussed herein.

Figure 9:
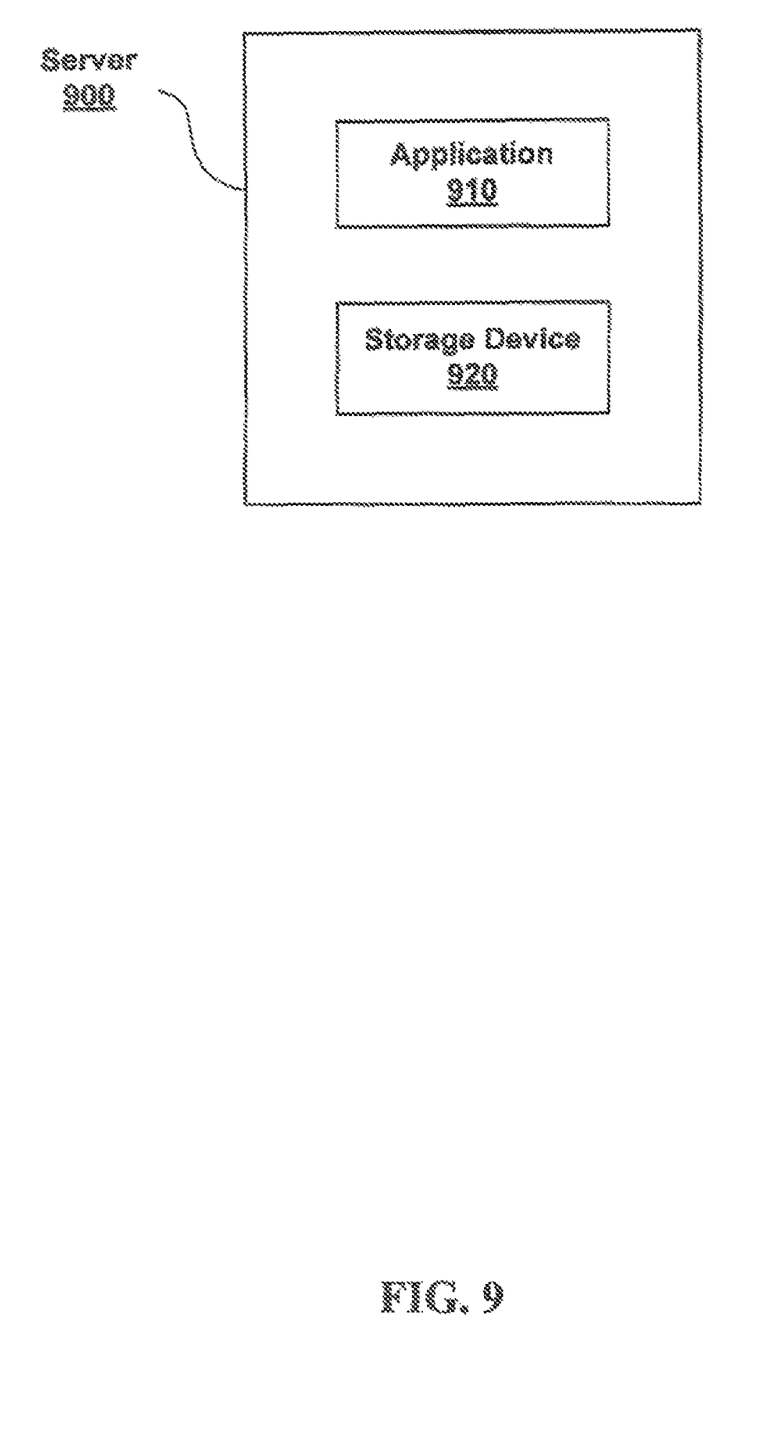
FIG. 9 illustrates a server, upon which embodiments of the present invention may be implemented.

FIG. 9 illustrates a server 900, upon which embodiments of the present invention may be implemented. As illustrated, the server 900 comprises an application 910, and a storage device 920. The application 910 is configured to run on the server, and configured to perform the functions of the net analyzer 100. The storage device 920 is configured to store information, such as net states, net configurations, and/or any other information used for a determination of the social metrics.

In various embodiments, the server 900 contains a computer readable medium having embodied thereon a program, the program being executable by a computing device for performing a method for social capital determination and use. The program is configured to receive circuit configuration information from a user; and return net state information to the user.

Various alternatives, modifications, and equivalents may also be used. For example, the net analyzer 100 may operate remotely or be accessed via a network. In another example, the net analyzer 100 may access multiple CPU located on different computers to perform net state analysis. Therefore, the above description should not be taken as limiting the scope of the invention which is defined by the appended claims.

While the invention is described in conjunction with various embodiments, it is understood that they are not intended to limit the invention to these embodiments. On the contrary, the invention is intended to cover alternatives, modifications and equivalents, which may be included within the spirit and scope of the invention as defined by the appended claims.

What is claimed is:

1. A method comprising:
   using a computer to derive a net equation representing a net state of a gate of an electronic circuit net, wherein the net equation is derived from at least one other net state;
   determining a truthfulness of the net equation; and
   reporting the truthfulness.

2. The method of claim 1, wherein the net state is selected from a group consisting of float, high, and low; and said reporting the truthfulness comprises reporting said net state of said gate.

3. The method of claim 1, wherein the net equation is a hypothesis of the net state.

4. The method of claim 1, further comprising substituting a term of the net equation, wherein the substitution is determined based on at least one additional net state.

5. The method of claim 4, wherein the substitution is determined based on a predetermined device configuration.

6. The method of claim 1, based on the truthfulness, further comprising determining a failure point of said gate of said electronic circuit net.

7. The method of claim 6, wherein the failure point is determined with one evaluation of the net equation.

8. The method of claim 6, wherein the failure point is determined with a logical certainty.

9. The method of claim 1, based on the truthfulness, further comprising determining all failure points of said gate of said electronic circuit net.

10. The method of claim 1, wherein the net equation is time domain independent.

11. The method of claim 1, wherein a failure point is determined with only a user input of power rail definitions.

12. The method of claim 1, further comprising predicting a certain net state will not Occur.

13. The method of claim 1, further comprising determining suspect failure points prior to the determining the truthfulness of the net equation.

14. A method comprising:
   using a computer to derive a net equation representing a net state of a gate of an electronic circuit net, wherein the net equation is derived from at least one other net state, wherein the net equation is a hypothesis of the net state; determining a truthfulness of the net equation; and reporting the truthfulness.

15. The method of claim 14, wherein the net state is selected from a group consisting of float, high, and low; and said reporting the truthfulness comprises reporting said net state of said gate.

16. The method of claim 14, further comprising substituting a term of the net equation, wherein a substitution is determined based on at least one additional net state.

17. The method of claim 16, wherein the substitution is determined based on a predetermined device configuration.

18. The method of claim 14, based on the truthfulness, further comprising determining a failure point of said gate of said electronic circuit net, wherein the failure point is determined with a logical certainty.

19. A non-transitory computer readable medium having embodied thereon a program, the program being executable by a computing device for performing a method for net state float, high, or low determination of a gate of an electronic circuit net, said method comprising: deriving a net equation representing a net state of said gate of said electronic circuit net, wherein the net equation is derived from at least one other net state; determining a truthfulness of the net equation; and reporting the truthfulness; wherein said reporting the truthfulness comprises reporting said net state of said gate.

20. The method of claim 19, based on the truthfulness, the method further comprising determining a failure point of said electronic circuit net, wherein the failure point is determined with a logical certainty.

* * * * *